United States Patent
Goode et al.

(10) Patent No.: US 11,656,789 B2
(45) Date of Patent: May 23, 2023

(54) ASYMMETRIC READ SENSE

(71) Applicant: Western Digital Technologies, Inc., San Jose, CA (US)

(72) Inventors: Jonas Goode, Lake Forest, CA (US); Richard Galbraith, Rochester, MN (US); Henry Yip, Bellflower, CA (US); Vinh Hoang, Laguna Hills, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 123 days.

(21) Appl. No.: 17/412,158

(22) Filed: Aug. 25, 2021

(65) Prior Publication Data

US 2023/0066469 A1   Mar. 2, 2023

(51) Int. Cl.
  *G06F 3/06* (2006.01)
  *G11C 29/50* (2006.01)
  *G11C 7/06* (2006.01)

(52) U.S. Cl.
  CPC .......... *G06F 3/0655* (2013.01); *G06F 3/0604* (2013.01); *G06F 3/0679* (2013.01); *G11C 7/06* (2013.01); *G11C 29/50004* (2013.01)

(58) Field of Classification Search
  CPC .... G06F 3/0655; G06F 3/0604; G06F 3/0679; G11C 7/06; G11C 29/50004;
  (Continued)

(56) References Cited

U.S. PATENT DOCUMENTS 8,000,135 B1   8/2011  Perlmutter et al.
8,923,062 B1  12/2014  Lee et al.
(Continued)

FOREIGN PATENT DOCUMENTS

CN    109390004 A  *  2/2019  ............ G06F 1/206
JP   2010075219 A  *  4/2010
(Continued)

OTHER PUBLICATIONS

International Search Report and Written Opinion for International Application No. PCT/US2022/028227 dated Aug. 31, 2022.
(Continued)

*Primary Examiner* — Fernando Hidalgo
(74) *Attorney, Agent, or Firm* — Patterson + Sheridan, LLP; Steven H. VerSteeg

(57) ABSTRACT

A data storage device includes a memory device including a plurality of wordlines, each including a plurality of cells, and a cell statistics generator (CSG) disposed on the memory device. The CSG includes logic configured to receive a first read sense at a threshold voltage of one or more threshold voltages of each cell of a wordline of the plurality of wordlines, determine that a second read sense is required based on the first read sense, receive the second read sense, determine a deviation parameter and a dispersion parameter for an asymmetric adjustment of the left threshold voltage and the right threshold voltage, and adjust the left threshold voltage and the right threshold voltage based on the deviation parameter and the dispersion parameter. The second read sense includes a plurality of left read senses at a left threshold voltage and a plurality of right senses at a right threshold voltage.

20 Claims, 6 Drawing Sheets

(58) Field of Classification Search
CPC ... G11C 16/26; G11C 11/5642; G11C 29/021; G11C 29/44; G11C 29/028
USPC .......................................................... 365/207
See application file for complete search history.

(56) References Cited

U.S. PATENT DOCUMENTS

| | | | |
|---|---|---|---|
| 9,269,448 | B2 | 2/2016 | Tang et al. |
| 9,484,098 | B1 | 11/2016 | Hsu et al. |
| 9,741,431 | B2 | 8/2017 | Kumar et al. |
| 9,842,023 | B2 | 12/2017 | Tang et al. |
| 10,236,070 | B2 | 3/2019 | Barndt et al. |
| 10,347,331 | B2 | 7/2019 | Zhang et al. |
| 11,295,819 | B2 | 4/2022 | Goode et al. |
| 11,443,828 | B1* | 9/2022 | Eisenhuth ............... G11C 29/44 |
| 11,494,114 | B1* | 11/2022 | Eisenhuth ............ G11C 29/021 |
| 2010/0324850 | A1 | 12/2010 | Jung et al. |
| 2016/0141048 | A1 | 5/2016 | Camp et al. |
| 2016/0148702 | A1 | 5/2016 | Karakulak et al. |
| 2016/0357631 | A1 | 12/2016 | Cohen |
| 2019/0056994 | A1 | 2/2019 | Shulkin et al. |
| 2019/0102084 | A1 | 4/2019 | Zhang et al. |
| 2019/0354313 | A1 | 11/2019 | Sheperek et al. |
| 2019/0391865 | A1 | 12/2019 | Cadloni et al. |
| 2020/0066354 | A1 | 2/2020 | Ioannou et al. |
| 2020/0090763 | A1* | 3/2020 | Tokutomi ............ G06F 11/1068 |
| 2020/0105353 | A1 | 4/2020 | Sharon et al. |
| 2020/0133570 | A1* | 4/2020 | Shadmi ................. G06F 3/0659 |
| 2021/0065819 | A1* | 3/2021 | Choi ....................... G11C 16/12 |
| 2021/0117270 | A1 | 4/2021 | Parat et al. |
| 2021/0383875 | A1* | 12/2021 | Lee ......................... G11C 29/50 |
| 2022/0100413 | A1* | 3/2022 | Kim ....................... G06F 3/0604 |
| 2022/0165338 | A1* | 5/2022 | Kim ........................ G11C 16/26 |
| 2022/0301653 | A1* | 9/2022 | Takada ................... G11C 29/42 |

FOREIGN PATENT DOCUMENTS

| | | | |
|---|---|---|---|
| KR | 20140091955 | A * | 7/2014 |
| KR | 20200019385 | A * | 2/2020 |

OTHER PUBLICATIONS

Berahas et al. "A theoretical and empirical comparison of gradient approximations in derivative-free optimization," arXiv preprint arXiv:1905.01332, Dec. 31, 2019, pp. 3-4, 12.

International Search Report and the Written Opinion for International Application No. PCT/US2020/066898, dated Mar. 3, 2021, 17 pages.

Kelley, C.T. "Iterative methods for optimization," Society for Industrial and Applied Mathematics, 1999, Dec. 31, 1999, pp. 17, 39-52.

Pulkkinen, S. "A Review of Methods for Unconstrained Optimization: Theory, Implementation and Testing," 2008, available at <https://core.ac.uk/download/pdf/14916847.pdf>, Dec. 31, 2008, Chapter 2.3. Gradient Descent Methods, pp. 13-36; Appendix A.5 Finite-Difference, Approximations, pp. 98-99.

Wikipedia Contributors, (Jun. 18, 2020). Finite difference. In Wikipedia, The Free Encyclopedia. Retrieved 13:49, Mar. 1, 2021, from URL <https://en.wikipedia.org/w/index.php?title=Finite_difference&oldid=963179578>, Jun. 18, 2020 (Jun. 18, 2020), Ch. "Relation with derivatives".

* cited by examiner

ASYMMETRIC READ SENSE

BACKGROUND OF THE DISCLOSURE

Field of the Disclosure

Embodiments of the present disclosure generally relate to error detection in a non-volatile memory (NVM) device, and more particularly, to setting voltage read levels in an NVM device.

Description of the Related Art

When reading data from a non-volatile memory (NVM) device such as a NAND, NOR, XOR, or other type of NVM device, voltages from cells on a wordline are read at a programmed hard decode voltage level. However, errors in cell voltage levels may be introduced by variances in device temperature, vibration, and/or wear, in addition to errors that may have been introduced during manufacturing, in addition to retention and program erase cycle degradation during use.

When a hard decode read is determined to be in error, one or more soft decode read voltage levels, typically placed about the hard decode voltage are used in error correction. Conventionally, soft decode voltage levels may be statically placed, using predetermined values that may not be responsive to conditions that cause errors to be generated outside of the predetermined voltages. In response, some data storage devices implement a 'valley search' method to provide adjustment to soft decode voltage levels, however valley search that seeks to optimize voltage hard decode read level positions, by finding the bottom of a shallow bit error rate (BER) valley. However, valley search may find incorrect local values for adjustment of hard decode voltages as it is susceptible to noise and unsymmetrical cell distributions, resulting in little to no performance improvement in detection or correction of errors.

What is needed are systems and methods to mitigate issues of prior approaches.

SUMMARY OF THE DISCLOSURE

The present disclosure generally relates to error detection in a non-volatile memory (NVM) device, and more particularly, to setting voltage read levels in an NVM device. A data storage device includes a memory device including a plurality of wordlines, each including a plurality of cells, and a cell statistics generator (CSG) disposed on the memory device. The CSG includes logic configured to receive a first read sense at a threshold voltage of one or more threshold voltages of each cell of a wordline of the plurality of wordlines, determine that a second read sense is required based on the first read sense, receive the second read sense, determine a deviation parameter and a dispersion parameter for an asymmetric adjustment of the left threshold voltage and the right threshold voltage, and adjust the left threshold voltage and the right threshold voltage based on the deviation parameter and the dispersion parameter. The second read sense includes a plurality of left read senses at a left threshold voltage and a plurality of right senses at a right threshold voltage.

In one embodiment, a data storage device includes a memory device including a plurality of wordlines, each including a plurality of cells, and a cell statistics generator (CSG) disposed on the memory device. The CSG includes logic configured to receive a first read sense at a threshold voltage of one or more threshold voltages of each cell of a wordline of the plurality of wordlines, determine that a second read sense is required based on the first read sense, determine a deviation parameter and a dispersion parameter for an asymmetric adjustment of the left threshold voltage and the right threshold voltage, and adjust the left threshold voltage and the right threshold voltage based on the deviation parameter and the dispersion parameter. The second read sense includes a plurality of left read senses at a left threshold voltage and a plurality of right senses at a right threshold voltage.

In another embodiment, a data storage device includes a memory device including a plurality of wordlines, each including a plurality of cells, and a cell statistics generator (CSG) disposed on the memory device. The CSG includes logic configured to receive a plurality of left read sense and a plurality of right read sense for a threshold voltage of a plurality of threshold voltages for each cell of the plurality of cells of a wordline of the plurality of wordlines, sum a plurality of received left read senses and a plurality of right read senses, calculate a deviation parameter and a dispersion parameter, and asymmetrically adjust the left read sense and the right read sense based on the deviation parameter and the dispersion parameter. An expectation value is subtracted from the summed plurality of received left read senses and the summed plurality of right read senses.

In another embodiment, a data storage device includes a memory means including a plurality of wordlines, each including a plurality of cells, and one or more cell statistics generators (CSGs) disposed on the memory means. The one or more CSGs each including logic configured to receive a plurality of left read senses at a first voltage from a threshold voltage of each cell of a wordline of the plurality of wordlines, receive a plurality of right read senses at a second voltage from the threshold voltage, determine a deviation parameter and a dispersion parameter to asymmetrically adjust the first voltage and the second voltage, and adjust the first voltage and the second voltage based on the deviation parameter and the dispersion parameter. The first voltage is substantially less than the threshold voltage. The second voltage is substantially greater than the threshold voltage. The first voltage and the second voltage are offset by a substantially equal voltage from the threshold voltage.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to error detection in a non-volatile memory (NVM) device, and more particularly, to setting voltage read levels in an NVM device. A data storage device includes a memory device including a plurality of wordlines, each including a plurality of cells, and a cell statistics generator (CSG) disposed on the memory device. The CSG includes logic configured to receive a first read sense at a threshold voltage of one or more threshold voltages of each cell of a wordline of the plurality of wordlines, determine that a second read sense is required based on the first read sense, receive the second read sense, determine a deviation parameter and a dispersion parameter for an asymmetric adjustment of the left threshold voltage and the right threshold voltage, and adjust the left threshold voltage and the right threshold voltage based on the deviation parameter and the dispersion parameter. The second read sense includes a plurality of left read senses at a left threshold voltage and a plurality of right senses at a right threshold voltage.

Figure 1:
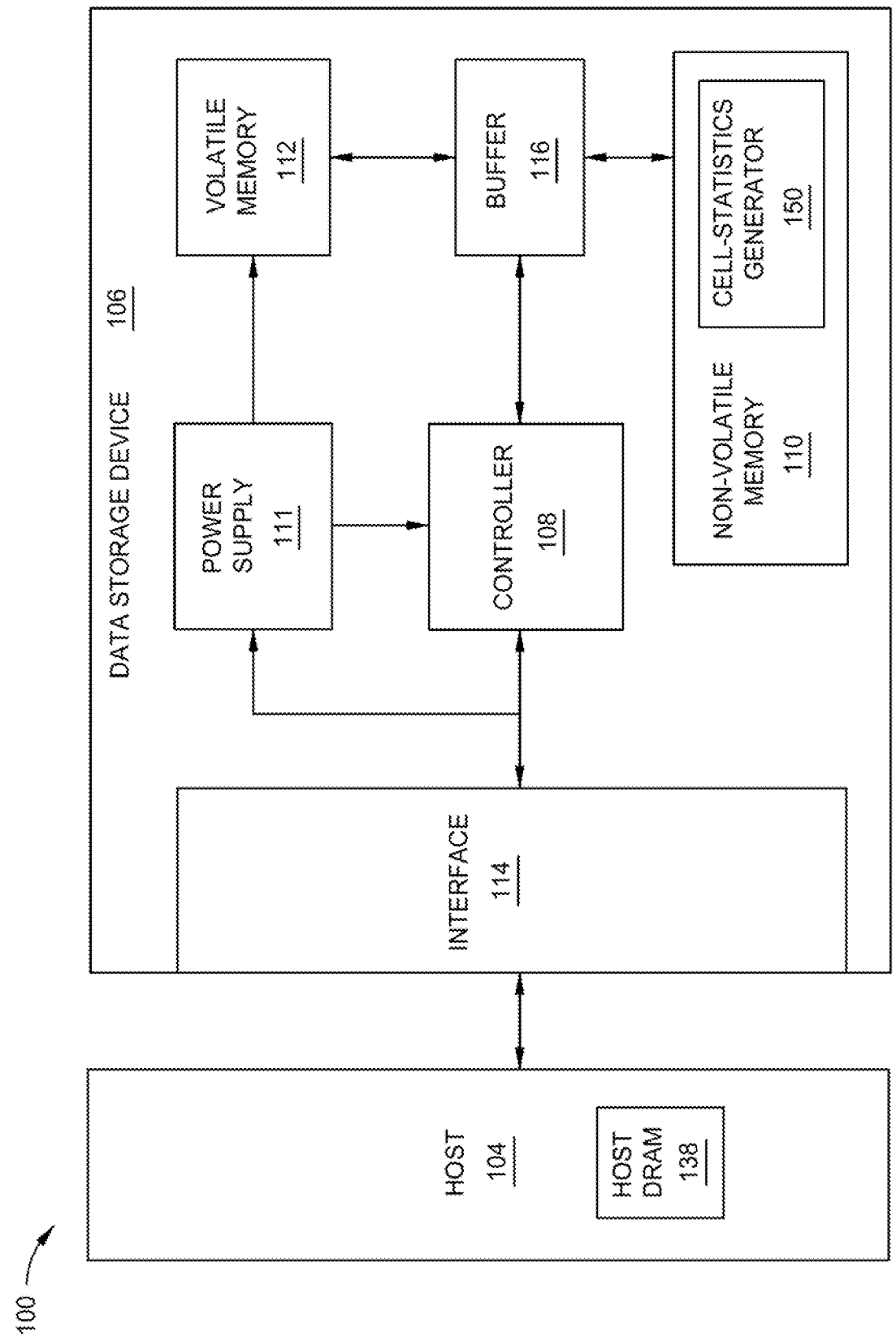
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The NVM 110 includes a cell statistics generator (CSG) 150. The CSG 150 is embedded in the NVM 110 in order to add arithmetic addition elements to the NVM 110. For example, the CSG 150 may be embedded in each NVM die of the NVM 110. The CSG 150 may assist with the optimization and the tuning of each NVM die. For example, the CSG 150 may allow parallel processing of dies in order for more efficient recovery and operations of the data storage device 106. In other embodiments, the CSG 150 may be implemented in the controller 108 or in a CMOS architecture, such as CMOS under the array (CUA), CMOS bonded array (CbA), or CMOS above the array (CAA)

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
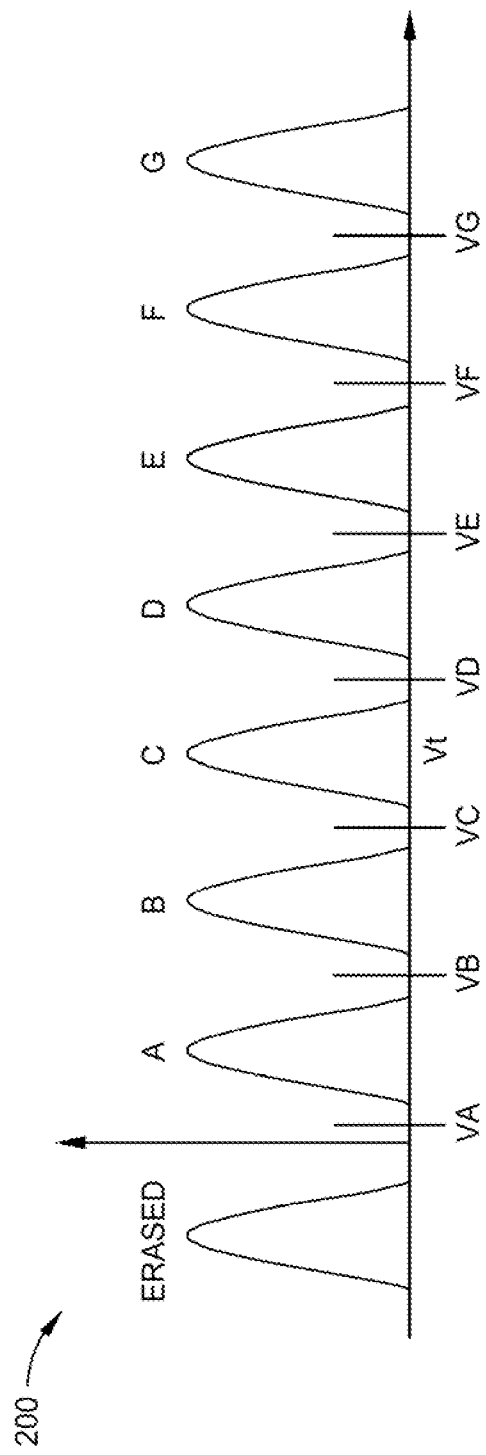
FIG. 2A is a graph illustrating threshold voltages for TLC memory, according to certain embodiments.

FIG. 2A is a graph 200 illustrating threshold voltages for TLC memory, according to certain embodiments. TLC memory includes 3 bits, where each bit may have a program state of either 0 or 1. The program state refers to the state of the memory cell, whether the memory cell is empty (i.e., no data exists) or the memory cell is programmed (i.e., data exists). Furthermore, the number of unique combinations of program states can be solved in the following equation: (Total number of voltage levels)=$2^{\text{(number of bits per memory cell)}}$. For the TLC memory, the number of voltage levels is eight because $2^3=8$.

As the number of bits of the memory cell increases, the memory cell can record more information leading to larger data storage. Furthermore, the equation for the unique combination of program states may be applied to SLC memory, TLC memory, QLC memory, penta-layer cell (PLC) memory, and other higher iterations of layer cell memory.

The program state of 0 refers to a programmed state, whereas the program state of 1 refers to an erased state. The TLC memory has 8 voltage levels, where one is erased and seven are programmed. Furthermore, the one voltage level that is erased has a bit combination of program state 111, according to certain embodiments. For any memory cell, if the bit combination only contains the program state 1, then the program state is erased (e.g., 1 for SLC, 11 for MLC, and 1111 for QLC). Listing from lowest threshold voltage, denoted by Vt on the x-axis, to highest threshold voltage in FIG. 2A, the voltage levels are 111 for the erased cell state, 110 for cell state A, 100 for cell state B, 000 for cell state C, 010 for cell state D, 011 for cell state E, 001 for cell state F, and 101 for cell state G, according to certain embodiments.

The bits for the cell state (e.g., ###) are upper page, middle page, lower page. Furthermore, the lines between the curves are labeled VA, VB, VC, VD, VE, VF, and VG are related to the threshold or reference voltage. For other memory cells, the number of threshold or reference voltages can be solved by the following equation: (number of threshold or reference voltages)=(total number of voltage levels)−1. The individual pages of data can be read by performing a number of comparisons at one or more threshold points and determining whether the cell voltage is lower or higher than the threshold.

Figure 2B:
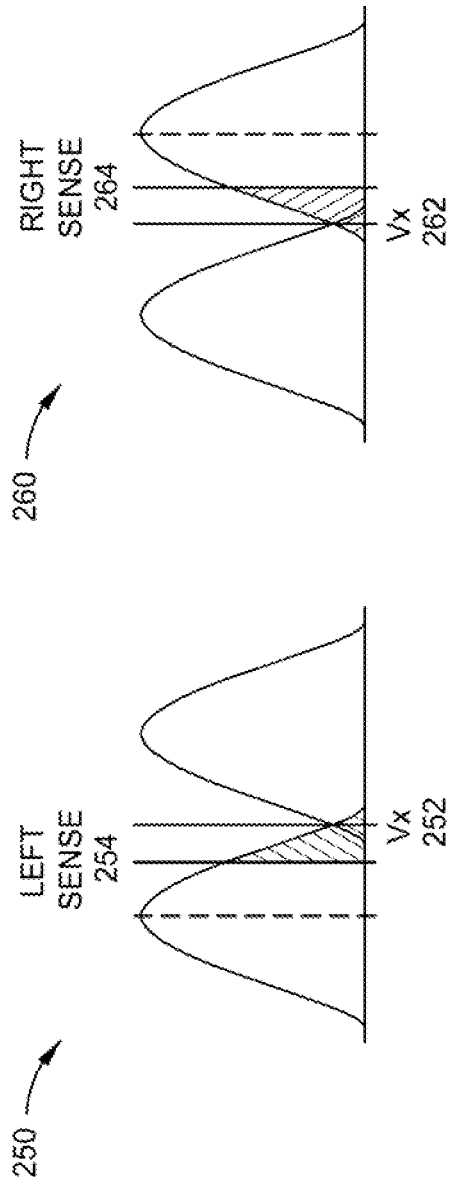
FIG. 2B are graphs illustrating a left sense and a right sense, according to certain embodiments.

FIG. 2B are graphs 250, 260 illustrating a left sense 254 and a right sense 264, according to certain embodiments. Vx 252, 262 are thresholds or reference voltages (i.e., a hard decode threshold), such as VA, VB, VC, VD, VE, VF, and VG of FIG. 2A. In the example described herein, Vx 252, 262 may be VD of FIG. 2A, such that cell state C is to the left of Vx 252, 262 and cell state D is to the right of Vx 252, 262. For simplification purposes herein, Vx 252 and Vx 262 are equal voltage values. However, in some embodiments, Vx 252 and Vx 262 are different voltage values, such as when either or both Vx 252 and Vx 262 are adjusted by a calculated deviation value (described below). When executing a sense at the threshold or reference voltage, the sense may be split into the left sense 254 (shown in graph 250) and the right sense 264 (shown in graph 260).

Likewise, the left sense 254 and the right sense 264 may be executed and read by a hard decode, such as a sense amplifier. The left sense 254 and the right sense 264 are iteratively executed (i.e., the error area is calculated) up to a 0.25 threshold offset (i.e., quarter bin spacing) from the mean voltage of the relevant cell state indicated by a dashed line. For example, the left sense 254 may be completed one or more times at a left read sense voltage, where the left read sense voltage moves further from the threshold or reference voltage at each increasing iteration. The left sense 254 and the right sense 264 may output an error or an error rate for the respective sense (e.g., the left sense 254 is used to determine the error or error rate for the cell state to the left of Vx 252).

The 0.25 threshold offset may be determined by a Q-function (e.g., $Q(x, \mu, \sigma)$), where the Q-function equals 0.5 for any sigma. The sensing between two Gaussian distributions spaced one bin apart and with a common sigma may be represented as: $\text{Sense}(x, \sigma)=[1-Q(x, 0.5, \sigma)]-Q(x, -0.5, \sigma)$. Therefore, using sense offsets of 0.25 (i.e., quarter bin spacing) leads to the end points of the transfer function being fixed and the transfer function slope, independent of the sigma, substantially equal to about 2. By executing the left sense 254 and the right sense 264 and the 0.25 threshold offset, the error (i.e., the threshold overlap between the cell state) of the adjacent relevant cell state is effectively 0. For example, the left sense 254 may cause the error of the cell state to the right of the Vx 252 to effectively be 0. In the description herein, reference to a left sense and a right sense refers to an error voltage value determined by the respective sense (e.g., the left sense 254 or the right sense 264).

A dispersion output or signal may be the difference of the right sense 264 and the left sense 254. The dispersion output or signal may be calculated as: $\text{Dispersion}=\text{Sense}(x+0.25, \sigma)-\text{Sense}(x-0.25, \sigma)$. A deviation output or signal may be the sum of the right sense 264 and the left sense 254. The deviation output or signal may be calculated as: $\text{Deviation}=\text{Sense}(x+0.25, \sigma)+\text{Sense}(x-0.25, \sigma)$.

Figure 3:
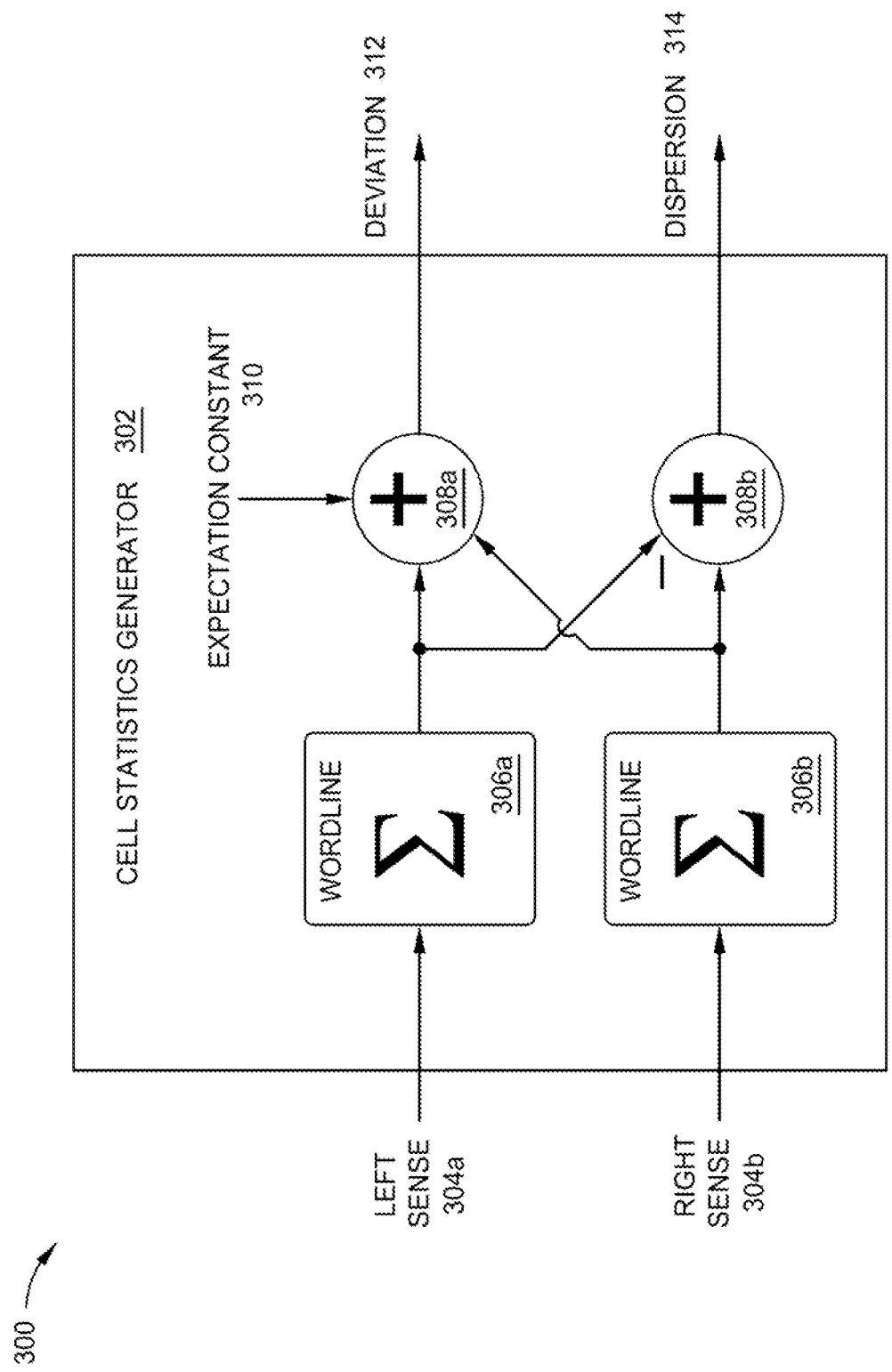
FIG. 3 is a schematic block diagram illustrating a cell statistics generator, according to certain embodiments.

FIG. 3 depicts a schematic block diagram 300 illustrating a CSG 302, according to certain embodiments. The CSG 302 may be the CSG 150 of FIG. 1. The CSG 302 receives a left sense 304a and a right sense 304b for a wordline of an NVM, such as the NVM 110 of FIG. 1. The left sense 304a may be the left sense 254, and the right sense 304b may be the right sense 264 of FIG. 2B. Because the left sense 304a and the right sense 304b are iterative senses, the plurality of left senses are accumulated at a first adder 306a for cells of a wordline of the NVM 110, and the plurality of right senses are accumulated at a second adder 306b for the same cells of the wordline of the NVM 110.

The accumulated left senses and the accumulated right senses are combined in a first combiner 308a operating in an additive mode with an expectation constant 310 (i.e., accumulated senses plus the expectation constant 310) to calculate a deviation output 312 and a second combiner 308b operating in a subtractive mode (i.e., accumulated senses minus the expectation constant 310) with the expectation constant 310 to calculate a dispersion output 314. The expectation constant 310 is a constant representing an expected accumulation value if read sense thresholds were optimal, and distributions very narrow. For example:
(1) Let N=total number of bins=$2^{\text{bits\_per\_cell}}$; by way of example a TLC has $2^3=8$ bins and 8−1=7 thresholds
(2) let i=threshold index tested=1 to (N−1)
(3) Expectation constant (EXP)=(i/N)*2*wordline_length; by way of example, a wordline_length may be 16 kBytes per page (16384*8=131072 cells per wordline)

The deviation output 312 is a zero-based linear error metric for shifting read sense voltage parameters to voltage levels optimal for detecting errors of cells of a wordline in a manner that minimizes false positive/negative error detection, and the dispersion output 314 represents an error count metric at a compressed bin spacing and is operable to shift read sense voltage levels while maintaining spacing between the left and right read senses. For example, adapting the threshold voltage shift parameters may include shifting the threshold voltage by an offset, such that the threshold voltage is substantially even in distance (e.g., voltage difference) from the adjacent cell states. The compressed bin spacing may be based on the relevant threshold offset (e.g., the 0.25 threshold offset).

Figure 4:
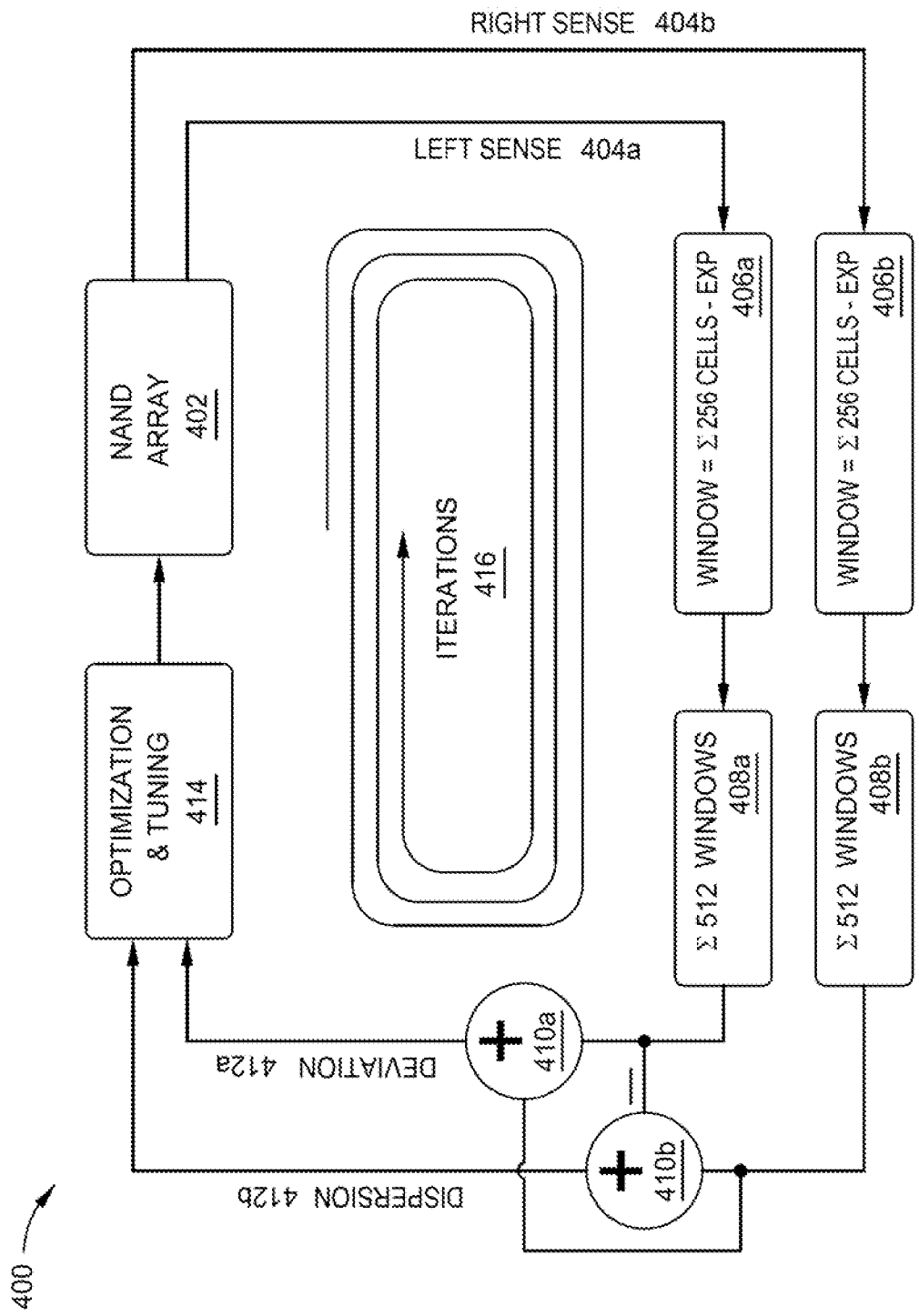
FIG. 4 is a flow diagram illustrating the operation of a cell statistics generator, according to certain embodiments.

FIG. 4 is a flow diagram 400 illustrating the operation of a CSG, such as the CSG 302 of FIG. 3, according to certain embodiments. A left sense 404a and a right sense 404b are executed on a wordline to determine a relevant threshold voltage of a NAND array 402 (e.g., sensing a cell state of the wordline). Although shown as both a left sense 404a and a right sense 404b, the senses may be decoupled, such that each sense is completed independently of each other and the accumulated sense is stored in a table to be used after both the left sense 404a and the right sense 404b have been completed. It is to be understood that in the description herein, a left read sense produces a negative result and a right read sense produces a positive result, where the results of the left read sense and the right read sense are calculated relative to the an optimal threshold voltage. A first adder 406a sums the left sense 404a for each of the cells of a wordline (e.g., 256 cells) and subtracts an expectation constant, such as the expectation constant 310 of FIG. 3, from the summation result. Likewise, a second adder 406b sums the right sense 404b for each of the cells and subtracts the expectation constant from the summation result.

After the first adder 406a and the second adder 406b adds the respective senses (i.e., the left sense 404a and the right sense 404b), each of the windows resulting from the first adder 406a and the second adder 406b are summed (e.g., the sum of 512 windows) at a respective third adder 408a and a respective fourth adder 408b. The results of the third adder 408a and the fourth adder 408b are combined at a first combiner 410a and at a second combiner 410b.

The first combiner 410a operates in an additive mode to calculate a deviation output 412a. The additive mode utilizes signed values (i.e., includes both negative and positive integers). In some embodiments, the first combiner 410*a* adds the accumulated left read sense values of the fourth adder 408*b* to the accumulated right read sense values of the third adder 408*a* and subtracts an expectation constant to obtain a signed value. Referring to the example above, the expectation constant is (i/N)*256 for each of the first adder 406*a* and second adder 406*b*. Based on the resulting value of first combiner 410*a*, the left read sense and right read sense are shifted together to the left (negative voltage direction) or to the right (positive voltage direction) as a pair. For example, if the deviation output 412*a* is negative, indicating an error in the negative direction, then the voltage of the left sense and the right sense are shifted in the positive voltage direction in order to reduce the error. If the deviation output 412*a* is positive, indicating an error in the possible direction, then the voltage of the left sense and the right sense are shifted in the negative voltage direction in order to reduce the error.

The second combiner 410*b* operates in a subtractive mode to calculate a dispersion output 412*b*, representing a total number of errors at a compressed bin spacing, by changing the sign of, and subtracting the accumulated left read sense values of the fourth adder 408*b* from the accumulated right read sense values of the third adder 408*a* to obtain a positive value. This positive value is used to determine the distance between the left read sense and right read sense. A target value T of total number of errors may be set to 10% of the total senses accumulated (e.g., 2*wordline_length). The subtractive mode utilizes unsigned values (i.e., includes only positive integers). The dispersion output 412*b* describes a bin adjustment of the left sense and the right sense. The bin may be described as a percentage of a voltage curve for the respective cell state that the left read sense or the right read sense is executed at. For example, if the dispersion output 412*b* is less than the desired T target value, indicating a distance between left and right senses being too small, the left sense is moved further left while the right sense is moved further right in order to increase the distance between left and right senses. If the dispersion output 412*b* is greater than the desired CT' target value, indicating a distance between left and right senses being too large, the left sense is moved toward the right while the right sense is moved toward the left in order to decrease the distance between left and right senses.

The deviation output 412*a* and the dispersion output 412*b* are provided to an optimization and tuning unit 414. The optimization and tuning unit 414 is configured to adjust the right and left sense voltages as well as adjust the compressed bin spacing of the relevant area for cells in a wordline. For example, the deviation output 412*a* is utilized to adjust the left and/or right read sense voltage, and the dispersion output 412*b* is used to adjust the compressed bin spacing (i.e., adjust the bin spacing of the cell state to the left of the threshold and the bin spacing of the cell state to the right of the threshold). The optimization and tuning of the NAND array 402 may require one or more iterations 416, such as three iterations, to achieve read threshold values that are optimized and tuned.

Figure 5:
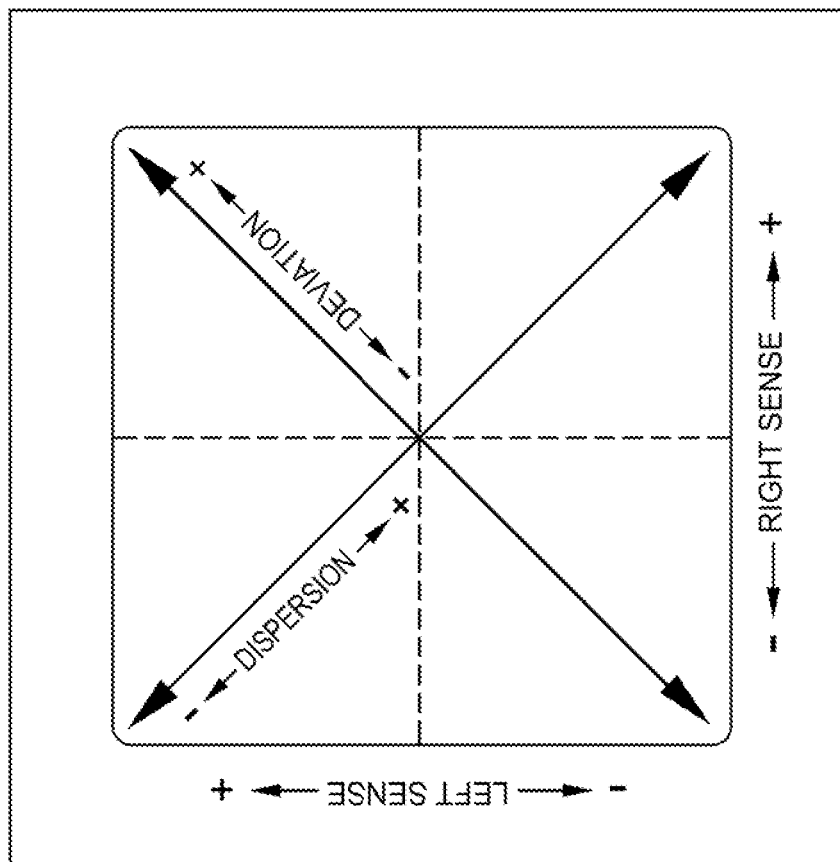
FIG. 5 is a graph illustrating dispersion-deviation based on a left sense and a right sense, according to certain embodiments.

FIG. 5 is a graph 500 illustrating dispersion-deviation based on a left sense and a right sense, according to certain embodiments. The right sense is the x-axis, and the left sense is the y-axis. The depicted plus (+) and minus (−) signs are indicative of a relatively higher (+) voltage versus a relatively lower (−) voltage, according to certain embodiments. The deviation output is a zero-based linear error metric for adapting parameters. The dispersion output represents an error count metric at a compressed bin spacing. The deviation output and the dispersion output are substantially orthogonal to each other, in that adjusting one of the deviation output or the dispersion output has little effect on the other, according to certain embodiments. By way of example, for the graph 500, If left sense is too high and right sense is too high then deviation output is positive; if left sense is too low and right sense is too low then deviation output is negative; if left sense is too high and right sense is too low then dispersion output is smaller (−); and if left sense is too low and right sense is too high then dispersion output is larger (+).

Figure 6:
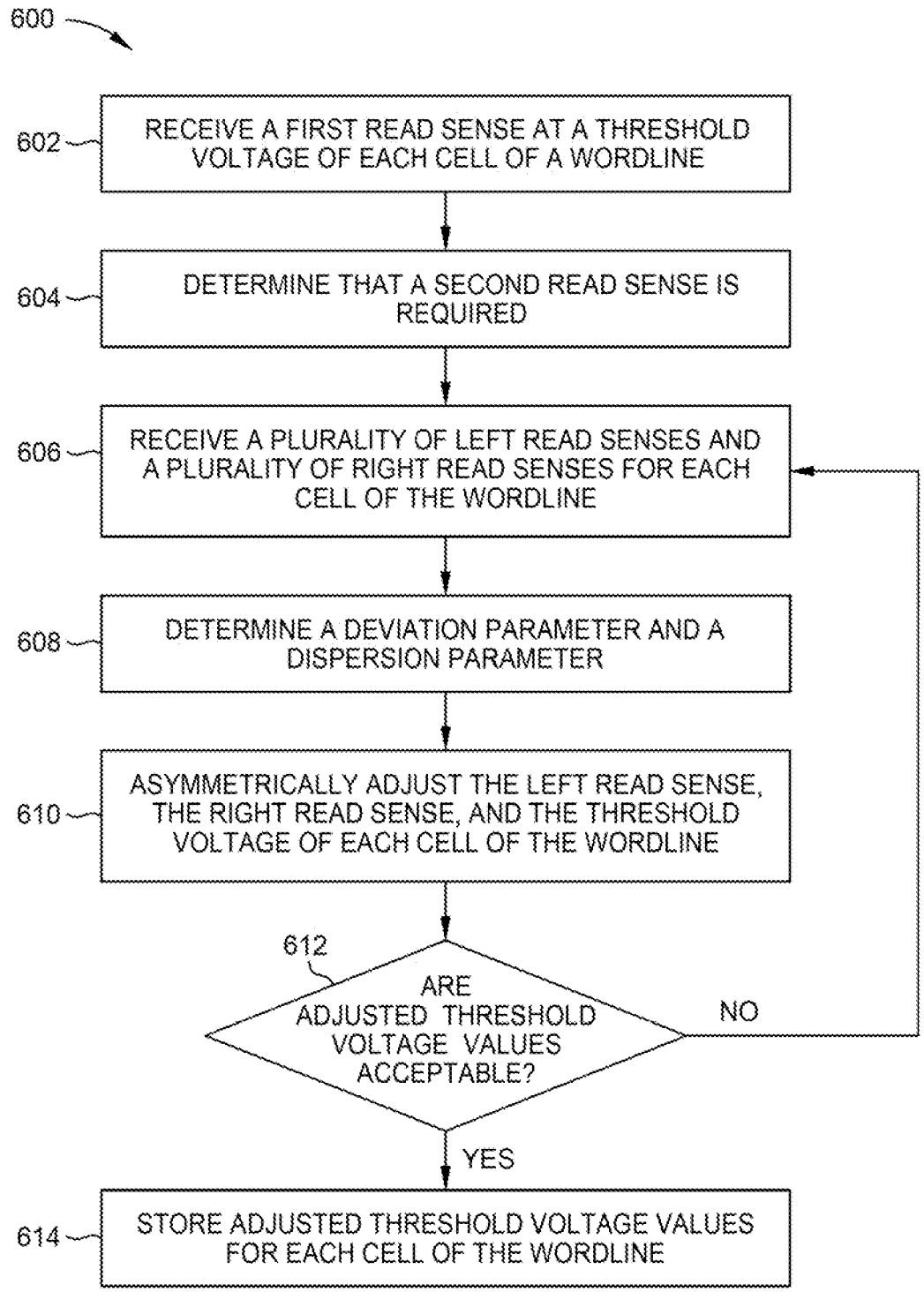
FIG. 6 is a flow diagram illustrating a method of asymmetrically adjusting a left sense voltage, a right sense voltage, and a threshold voltage of each cell of a wordline, according to certain embodiments.

FIG. 6 is a flow diagram illustrating a method 600 of asymmetrically adjusting a left sense voltage, such as the voltage at the left sense 254 of FIG. 2B, a right sense voltage, such as the voltage at the right sense 264 of FIG. 2B, and a threshold voltage, such as Vx 252, 262 of FIG. 2B, of each cell of a wordline, according to certain embodiments. Method 600 may be implemented by a CSG, such as the CSG 150 of FIG. 1 or the CSG 302 of FIG. 3. Furthermore, method 600 may occur for each (or up to the same number of) threshold voltage of plurality of threshold voltages of the memory device. For example, TLC memory includes 7 threshold voltages. Thus, method 600 may be executed to optimize and tune each of the 7 threshold voltages of TLC memory.

At block 602, the CSG 150, 302 receives a first read sense at a threshold voltage of each cell of a wordline. For example, the threshold voltage may refer to any of the threshold voltages VA, VB, VC, etc. of FIG. 2A for a TLC memory device. Although a TLC memory device is used as an example, the embodiments described may be applied to other memory densities, such as SLC, MLC, QLC, PLC, and the like. At block 604, the CSG 150, 302 determines that a second read sense is required. The determining may be based on determining that a decoding failure based on the first read sense has occurred. The decoding failure may be due to determining that one or more bit flips have occurred at the threshold voltage or the number of bit flips exceeds a threshold value. For example, the decoding may be completed by an error correction code (ECC) engine or a low-density parity-check (LDPC) engine. The previously listed decoder engines are not intended to be limiting, but to provide an example of possible decoder engines. The decoder engine may be included as part of a controller, such as the controller 108 of FIG. 1, or coupled between the NVM, such as the NVM 110 of FIG. 1, and the controller 108. The CSG 150, 302 may include an expected bit value for the decode at the threshold voltage.

For example, if the first read sense at the threshold voltage is supposed to return a bit value of "1," but a bit value of "0" is returned, the CSG 150, 302 may determine that an additional read sense is required. The additional read sense may be referred to as a soft bit read retry, where a read sense is completed at a left threshold voltage and a right threshold voltage. The left threshold voltage and the right threshold voltage may be initially set at equal distances in voltage value from the threshold voltage, where the left threshold voltage is substantially less than the threshold voltage and the right threshold voltage is substantially greater than the threshold voltage.

At block 606, the CSG 150, 302 receives and accumulates a left read sense and a right read sense for each cell of the wordline with the first adder 406*a* and second adder 406*b* respectively, where the left read sense is completed at the left threshold voltage and the right read sense is completed at the right threshold voltage. At block 608, the CSG 150, 302 determines a deviation parameter, such as the deviation output 412a of FIG. 4, and a dispersion parameter, such as the dispersion output 412b of FIG. 4, which may resemble the operation of the CSG described in FIG. 4. At block 610, the CSG 150, 302 utilizes an optimization and tuning unit, such as the optimization and tuning unit 414 of FIG. 4, to asymmetrically adjust the left read sense, the right read sense, and the threshold voltage of each cell of the wordline.

For example, the left read sense and the right read sense of each cell of the wordline relative to the threshold voltage may be shifted together in the negative voltage direction or in the positive voltage direction based on the deviation parameter. Likewise, a bin spacing of the left read sense and the right read sense may be adjusted based on the dispersion parameter. Adjusting the bin spacing may cause the left threshold voltage and the right threshold voltage to be both shifted closer to the threshold voltage or further from the threshold voltage. By optimizing and tuning the left threshold voltage and the right threshold voltage, the threshold voltage is effectively shifted or adjusted. It is to be understood that the left threshold voltage, the right threshold voltage, and the threshold voltage may not be adjusted at block 610 based on the deviation parameter and the dispersion parameter. For example, if the deviation parameter equals about 0, then the left threshold voltage and the right threshold voltage does not need to be shifted. However, if the deviation parameter is a positive number, then the left threshold voltage and the right threshold voltage will need to be shifted in the negative voltage direction.

At block 612, the CSG 150, 302 determines if the adjusted left threshold voltage value, the adjusted right threshold voltage value, and the adjusted threshold voltage values are within an acceptable range. According to certain embodiments, a sense adjustment is in steps of 1/32 of a nominal bin width. An example criteria for progressing to block 614 may be that the total adjustment to each of the left and right senses is less than 1 step representing 1/32 of a nominal bin width. For example, the CSG 150, 302 may include an expected bit value for each of the read senses at the various voltages. If the adjusted left threshold voltage, the adjusted right threshold voltage, and the adjusted threshold voltage values are not acceptable, such that they were adjusted at block 610, another set of left read senses at the adjusted left threshold voltage and another set of right read senses at the adjusted right threshold voltage are executed and received by the CSG 150, 302 at block 606. The steps at blocks 606, 608, 610, and 612 may be repeated a plurality of times, such as about three times. At block 614, the CSG 150, 302 stores the adjusted left threshold voltage value, the adjusted right threshold voltage value, and the adjusted threshold voltage values of each cell of the wordline of the plurality of wordlines such that future read operations utilizes the optimized and tuned threshold voltage values.

By asymmetrically adjusting a left threshold voltage value and a right threshold value of a soft bit decode, more accurate read senses may occur and a decreased amount of bit errors may be achieved.

In one embodiment, a data storage device includes a memory device including a plurality of wordlines, each including a plurality of cells, and a cell statistics generator (CSG) disposed on the memory device. The CSG includes logic configured to receive a first read sense at a threshold voltage of one or more threshold voltages of each cell of a wordline of the plurality of wordlines, determine that a second read sense is required based on the first read sense, determine a deviation parameter and a dispersion parameter for an asymmetric adjustment of the left threshold voltage and the right threshold voltage, and adjust the left threshold voltage and the right threshold voltage based on the deviation parameter and the dispersion parameter. The second read sense includes a plurality of left read senses at a left threshold voltage and a plurality of right senses at a right threshold voltage.

The logic is further configured to sum, for the wordline, each of the plurality of left senses and sum, for the wordline, each of the plurality of right senses and subtract an expectation constant from each of the sums. The deviation parameter is a sum of the sum of the plurality of left senses and the sum of the plurality of right senses. The dispersion parameter is a difference between the sum of the plurality of left senses and the sum of the plurality of right senses. The logic is further configured to, based on the deviation parameter, either increase the left threshold voltage and the right threshold voltage or decrease the left threshold voltage and the right threshold voltage. The logic is further configured to, based on the dispersion parameter, either shift the left threshold voltage and the right threshold voltage closer to the threshold voltage or shift the left threshold voltage and the right threshold voltage further from the threshold voltage. The logic is further configured to receive the plurality of left senses and the plurality of right senses, adjust the left threshold voltage and the right threshold voltage by the deviation parameter and the dispersion parameter, and re-receive the plurality of left senses and the plurality of right senses. The logic is further configured to re-receive the plurality of left senses and the plurality of right senses based on an adjusted left threshold voltage and an adjusted right threshold voltage more than once. The logic is further configured to, upon re-receiving the plurality of left senses and the plurality of right senses, determine whether further adjusting of the left threshold voltage and the right threshold voltage is needed based on a number of bit flips, based on determining that further adjusting is needed, re-determine the deviation parameter and the dispersion parameter, and based on the re-determining, re-adjust the left threshold voltage and the right threshold voltage by the deviation parameter and the dispersion parameter.

In another embodiment, a data storage device includes a memory device including a plurality of wordlines, each including a plurality of cells, and a cell statistics generator (CSG) disposed on the memory device. The CSG includes logic configured to receive a plurality of left read sense and a plurality of right read sense for a threshold voltage of a plurality of threshold voltages for each cell of the plurality of cells of a wordline of the plurality of wordlines, sum a plurality of received left read senses and a plurality of right read senses, calculate a deviation parameter and a dispersion parameter, and asymmetrically adjust the left read sense and the right read sense based on the deviation parameter and the dispersion parameter. An expectation value is subtracted from the summed plurality of received left read senses and the summed plurality of right read senses.

The CSG includes a first adder and a second adder. The first adder is configured to sum the plurality of received left read senses and subtract the expectation value from the summed plurality of received left read senses. The second adder is configured to sum the plurality of received right read senses and subtract the expectation value from the summed plurality of right read senses. The CSG further includes a third adder and a fourth adder. The third adder is configured to sum a first plurality of results from the first adder. The fourth adder is configured to sum a second plurality of results from the second adder. The CSG further includes a first combiner and a second combiner. The first combiner is configured to calculate the deviation parameter. The second combiner is configured to calculate the dispersion parameter. The deviation parameter is calculated by summing a first sum of the third adder and a second sum of the fourth adder. The dispersion parameter is calculated by subtracting a first sum of the third adder from a second sum of the fourth adder. The logic is configured to adjust a bin spacing of the left read sense and the right read sense based on the dispersion parameter. The logic is configured to subtract a voltage value or adds a voltage value to both the voltage of the left read sense and the voltage of the right read sense based on the deviation parameter.

In another embodiment, a data storage device includes a memory means including a plurality of wordlines, each including a plurality of cells, and one or more cell statistics generators (CSGs) disposed on the memory means. The one or more CSGs each including logic configured to receive a plurality of left read senses at a first voltage from a threshold voltage of each cell of a wordline of the plurality of wordlines, receive a plurality of right read senses at a second voltage from the threshold voltage, determine a deviation parameter and a dispersion parameter to asymmetrically adjust the first voltage and the second voltage, and adjust the first voltage and the second voltage based on the deviation parameter and the dispersion parameter. The first voltage is substantially less than the threshold voltage. The second voltage is substantially greater than the threshold voltage. The first voltage and the second voltage are offset by a substantially equal voltage from the threshold voltage.

The receiving the plurality of left read senses, the receiving the plurality of right read senses, and the determining occurs more than once. The logic is further configured to determine a number of bit flips of the plurality of left read senses and the plurality of right read senses. The logic is further configured to determine a first voltage shift for the left read sense and a second voltage shift for the right read sense upon determining that the number of bit flips of either the plurality of left read senses, the plurality of right read senses, or both the plurality of left read senses and the plurality of right read senses is greater than a threshold value.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device comprising a plurality of wordlines, each comprising a plurality of cells; and
a cell statistics generator (CSG) disposed on the memory device, the CSG comprising logic configured to:
receive a first read sense at a threshold voltage of one or more threshold voltages of each cell of a wordline of the plurality of wordlines;
determine that a second read sense is required based on the first read sense, wherein the second read sense comprises a plurality of left senses at a left threshold voltage and a plurality of right senses at a right threshold voltage;
determine a deviation parameter and a dispersion parameter for an asymmetric adjustment of the left threshold voltage and the right threshold voltage; and
adjust the left threshold voltage and the right threshold voltage based on the deviation parameter and the dispersion parameter.

2. The data storage device of claim 1, wherein the logic is further configured to sum, for the wordline, each of the plurality of left senses and sum, for the wordline, each of the plurality of right senses and subtract an expectation constant from each of the sums.

3. The data storage device of claim 2, wherein the deviation parameter is a sum of the sum of the plurality of left senses and the sum of the plurality of right senses, and wherein the dispersion parameter is a difference between the sum of the plurality of left senses and the sum of the plurality of right senses.

4. The data storage device of claim 3, wherein the logic is further configured to, based on the deviation parameter, either:
increase the left threshold voltage and the right threshold voltage; or
decrease the left threshold voltage and the right threshold voltage.

5. The data storage device of claim 3, wherein the logic is further configured to, based on the dispersion parameter, either:
shift the left threshold voltage and the right threshold voltage closer to the threshold voltage; or
shift the left threshold voltage and the right threshold voltage further from the threshold voltage.

6. The data storage device of claim 1, wherein the logic is further configured to:
receive the plurality of left senses and the plurality of right senses;
adjust the left threshold voltage and the right threshold voltage by the deviation parameter and the dispersion parameter; and
re-receive the plurality of left senses and the plurality of right senses.

7. The data storage device of claim 6, wherein the logic is further configured to re-receive the plurality of left senses and the plurality of right senses based on an adjusted left threshold voltage and an adjusted right threshold voltage more than once.

8. The data storage device of claim 7, wherein the logic is further configured to, upon re-receiving the plurality of left senses and the plurality of right senses:
determine whether further adjusting of the left threshold voltage and the right threshold voltage is needed based on a number of bit flips;
based on determining that further adjusting is needed, re-determine the deviation parameter and the dispersion parameter; and
based on the re-determining, re-adjust the left threshold voltage and the right threshold voltage by the deviation parameter and the dispersion parameter.

9. A data storage device, comprising:
a memory device comprising a plurality of wordlines, each comprising a plurality of cells; and
a cell statistics generator (CSG) disposed on the memory device, the CSG comprising logic configured to:
receive a plurality of left read senses and a plurality of right read senses for a threshold voltage of a plurality of threshold voltages for each cell of the plurality of cells of a wordline of the plurality of wordlines;
sum a plurality of received left read senses and a plurality of right read senses, wherein an expectation value is subtracted from the summed plurality of received left read senses and the summed plurality of right read senses;
calculate a deviation parameter and a dispersion parameter; and asymmetrically adjust the plurality of left read senses and the plurality of right read senses based on the deviation parameter and the dispersion parameter.

10. The data storage device of claim 9, wherein the CSG comprises a first adder and a second adder, wherein the first adder is configured to sum the plurality of received left read senses and subtract the expectation value from the summed plurality of received left read senses, and wherein the second adder is configured to sum the plurality of received right read senses and subtract the expectation value from the summed plurality of right read senses.

11. The data storage device of claim 10, wherein the CSG further comprises a third adder and a fourth adder, wherein the third adder is configured to sum a first plurality of results from the first adder, and wherein the fourth adder is configured to sum a second plurality of results from the second adder.

12. The data storage device of claim 11, wherein the CSG further comprises a first combiner and a second combiner, wherein the first combiner is configured to calculate the deviation parameter, and wherein the second combiner is configured to calculate the dispersion parameter.

13. The data storage device of claim 12, wherein the deviation parameter is calculated by summing a first sum of the third adder and a second sum of the fourth adder.

14. The data storage device of claim 12, wherein the dispersion parameter is calculated by subtracting a first sum of the third adder from a second sum of the fourth adder.

15. The data storage device of claim 9, wherein the logic is configured to adjust a bin spacing of the left read sense and the right read sense based on the dispersion parameter.

16. The data storage device of claim 9, wherein the logic is configured to subtract a voltage value or adds a voltage value to both the voltage of the left read sense and the voltage of the right read sense based on the deviation parameter.

17. A data storage device, comprising:
memory means comprising a plurality of wordlines, each comprising a plurality of cells; and
one or more cell statistics generators (CSGs) disposed on the memory means, the one or more CSGs each comprising logic configured to:
receive a plurality of left read senses at a first voltage from a threshold voltage of each cell of a wordline of the plurality of wordlines, wherein the first voltage is substantially less than the threshold voltage;
receive a plurality of right read senses at a second voltage from the threshold voltage, wherein the second voltage is substantially greater than the threshold voltage, and wherein the first voltage and the second voltage are offset by a substantially equal voltage from the threshold voltage;
determine a deviation parameter and a dispersion parameter to asymmetrically adjust the first voltage and the second voltage; and
adjust the first voltage and the second voltage based on the deviation parameter and the dispersion parameter.

18. The data storage device of claim 17, wherein the receiving the plurality of left read senses, the receiving the plurality of right read senses, and the determining occurs more than once.

19. The data storage device of claim 17, wherein the logic is further configured to determine a number of bit flips of the plurality of left read senses and the plurality of right read senses.

20. The data storage device of claim 19, wherein the logic is further configured to determine a first voltage shift for the left read sense and a second voltage shift for the right read sense upon determining that the number of bit flips of either the plurality of left read senses, the plurality of right read senses, or both the plurality of left read senses and the plurality of right read senses is greater than a threshold value.

* * * * *